United States Patent
Beinlich (10) Patent No.: US 10,170,976 B2
(45) Date of Patent: Jan. 1, 2019

(54) PHASE COMPENSATION METHOD FOR POWER FACTOR CORRECTION CIRCUIT

(71) Applicant: DET International Holding Limited, Grand Cayman (KY)

(72) Inventor: Dominik Reinhard Beinlich, Samutprakarn (TH)

(73) Assignee: DELTA ELECTRONICS (THAILAND) PUBLIC COMPANY, LIMITED, Samutprakarn (TH)

( * ) Notice: Subject to any disclaimer, the term of this patent is extended or adjusted under 35 U.S.C. 154(b) by 0 days.

(21) Appl. No.: 15/497,332

(22) Filed: Apr. 26, 2017

(65) Prior Publication Data

US 2018/0316260 A1    Nov. 1, 2018

(51) Int. Cl.
*H02P 1/24*    (2006.01)
*H02M 1/42*   (2007.01)
(Continued)

(52) U.S. Cl.
CPC ............ *H02M 1/4208* (2013.01); *G05F 1/70* (2013.01); *H02P 23/26* (2016.02); *H03D 3/001* (2013.01); *H03D 3/02* (2013.01)

(58) Field of Classification Search
CPC ...... H02P 23/26; H02P 23/0081; H02P 27/06; G05F 1/70; H02M 1/4208; H02J 3/1892; H02K 17/28
(Continued)

(56) References Cited

U.S. PATENT DOCUMENTS 6,759,837 B2 *  7/2004  Gandhi ............... G01R 21/133
                                                          324/142
2005/0035815 A1   2/2005  Cheng et al.
(Continued)

FOREIGN PATENT DOCUMENTS

CN      105556817 A    5/2016
CN      103928928 B    8/2016
(Continued)

OTHER PUBLICATIONS

Wanfeng Zhang, et al., A Digital Power Factor Correction (PFC) Control Strategy Optimized for DSP, IEEE Transactions on Power Electronics, vol. 19, No. 6, Nov. 2004, pp. 1474-1485.
(Continued)

*Primary Examiner* — Jorge L Carrasquillo
(74) *Attorney, Agent, or Firm* — Kirton McConkie; Evan R. Witt (57) ABSTRACT

A method for phase compensating a power factor correction circuit is provided. Firstly, a present current value of an input current is sampled, and the sampled signal is filtered. Then, a present waveform of the input current corresponding to the present current value of the filtered sampled signal and a previous waveform of the input current corresponding to a previous current value of the filtered sampled signal are predicted, and a current error signal is generated according to a difference between the present waveform and the previous waveform. Then, the current error signal is adjusted, and an adjusted signal is generated. Then, a feedforward signal is added to the adjusted signal, and a phase compensation signal. Then, a current control signal is added to the phase compensation signal, and a pulse width modulation signal is generated to control a switching circuit.

7 Claims, 5 Drawing Sheets

(51) Int. Cl.
*G05F 1/70* (2006.01)
*H02P 23/26* (2016.01)
*H03D 3/00* (2006.01)
*H03D 3/02* (2006.01)

(58) Field of Classification Search
USPC .................................. 318/792, 568.22, 632
See application file for complete search history.

(56) References Cited

U.S. PATENT DOCUMENTS

| | | | |
|---|---|---|---|
| 2013/0181654 A1* | 7/2013 | Rozman | H02M 5/4585 318/721 |
| 2014/0225545 A1* | 8/2014 | Becerra | H02P 6/14 318/400.26 |
| 2015/0263609 A1* | 9/2015 | Weida | H02M 3/156 323/234 |
| 2015/0364988 A1 | 12/2015 | Lu et al. | |

FOREIGN PATENT DOCUMENTS

| | | |
|---|---|---|
| CN | 106099943 A | 11/2016 |
| TW | 352487 B | 2/1999 |
| TW | 200717990 A | 5/2007 |
| TW | 201316660 A | 4/2013 |

OTHER PUBLICATIONS

Wanfeng Zhang, et al., A New Duty Cycle Control Strategy for Power Factor Correction and FPGA Implementation, IEEE Transactions on Power Electronics, vol. 21, No. 6, Nov. 2006, pp. 1745-1753.

Wanfeng Zhang, et al., A New Predictive Control Strategy for Power Factor Correction, 0-7803-7768-0/03/$17.00 (C) 2003 IEEE, pp. 403-409.

* cited by examiner

PHASE COMPENSATION METHOD FOR POWER FACTOR CORRECTION CIRCUIT

FIELD OF THE INVENTION

The present invention relates to a phase compensation method, and more particularly to a phase compensation method for a power factor correction circuit.

BACKGROUND OF THE INVENTION

Generally, the load for a power converter has diversified forms. For example, the load includes a resistive impedance, an inductive impedance, a capacitive impedance, or a combination thereof. When the input current to the load and the input voltage to load are in phase, the power factor is close to 1. If the power factor is lower than 1, the transmitted power possibly loses because of phase mismatch between the current and the voltage or noise.

For avoiding the power factor reduction and increasing the power transmission efficiency, the conventional power converter has a power factor correction function. For example, the conventional power converter is usually equipped with an active type power factor correction circuit to achieve the power factor correction function. The power factor correction circuit is controlled in a feedforward control manner. That is, the power factor correction circuit samples the AC input voltage and adjusts the output current according to the AC input voltage. Consequently, the AC input current is changed with the AC input voltage. In such way, the AC input current with a nearly sine wave and identical phase is obtained. Consequently, the power factor is increased, and the total harmonic distortion is increased.

However, the conventional power factor correction circuit still has some drawbacks. For example, the conventional power factor correction circuit usually comprises a bridge rectifier diode and a high frequency filtering capacitor. Since the bridge rectifier diode has forward voltage drop and the high frequency filtering capacitor is located downstream of the bridge rectifier diode, the AC input current may cease and distort in the vicinity of the zero-crossing point of the AC output voltage. Under this circumstance, the zero-crossing distortion occurs. Consequently, the total harmonic distortion increases, and the power factor decreases.

Therefore, there is a need of providing an improved phase compensation method for a power factor correction circuit in order to overcome the above drawbacks.

SUMMARY OF THE INVENTION

The present invention provides a phase compensation method for a power factor correction circuit in order to effectively suppress the zero-crossing distortion, decreases the total harmonic distortion and increase the power factor.

In accordance with an aspect of the present invention, there is provided a method for phase compensating a power factor correction circuit. The power factor correction circuit includes a switching circuit and a control unit, and receives an input voltage and an input current. Under control of the control unit, the switching circuit is alternately turned on or turned off to generate an output voltage and an output current. The control unit includes a low-pass filter, a differential controller and a cosine multiplier. The low-pass filter continuously receives a sampled signal that reflects a present current value of the input current. The phase compensation method includes the following steps. In a step (a), the low-pass filter filters the sampled signal. In a step (b), the differential controller predicts a present waveform of the input current corresponding to the present current value of the filtered sampled signal and a previous waveform of the input current corresponding to a previous current value of the filtered sampled signal, and generates a current error signal according to a difference between the present waveform and the previous waveform. In a step (c), the cosine multiplier adjusts the current error signal, thereby generating an adjusted signal. In a step (d), a feedforward signal is added to the adjusted signal, thereby generating a phase compensation signal. In a step (e), a current control signal is added to the phase compensation signal, thereby generating a pulse width modulation signal to control the switching circuit.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
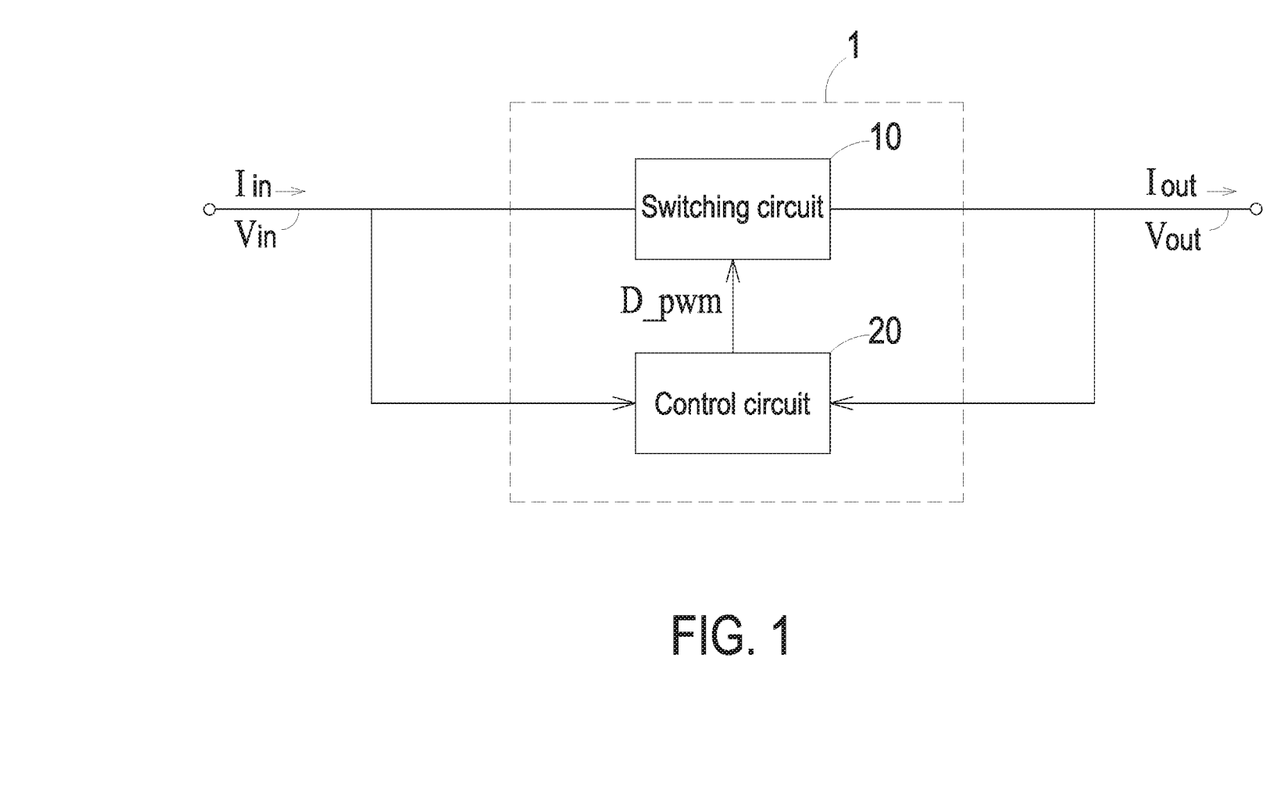
FIG. 1 is a schematic circuit diagram illustrating the architecture of a power factor correction circuit according to an embodiment of the present invention.

FIG. 1 is a schematic circuit diagram illustrating the architecture of a power factor correction circuit according to an embodiment of the present invention. The power factor correction circuit 1 can be applied to a power converter (not shown) in order to increase the power factor of the power converter. The power factor correction circuit 1 receives an input current Iin and an input voltage Vin and generates an output current Iout and an output voltage Vout. The power factor correction circuit 1 comprises a switching circuit 10 and a control circuit 20. By alternately turning on or turning off the switching circuit 10, the power factor correction circuit 1 generates the output current Iout and the output voltage Vout. The control unit 20 generates a pulse width modulation signal D_pwm according to the input current Iin, the input voltage Vin and the output voltage Vout. The switching circuit 10 is controlled by the control unit 20 according to the pulse width modulation signal D_pwm. Consequently, the phase of the input current Iin and the phase of the input voltage Vin are adjusted to be identical. In addition, the zero-crossing distortion can be suppressed.

Figure 2:
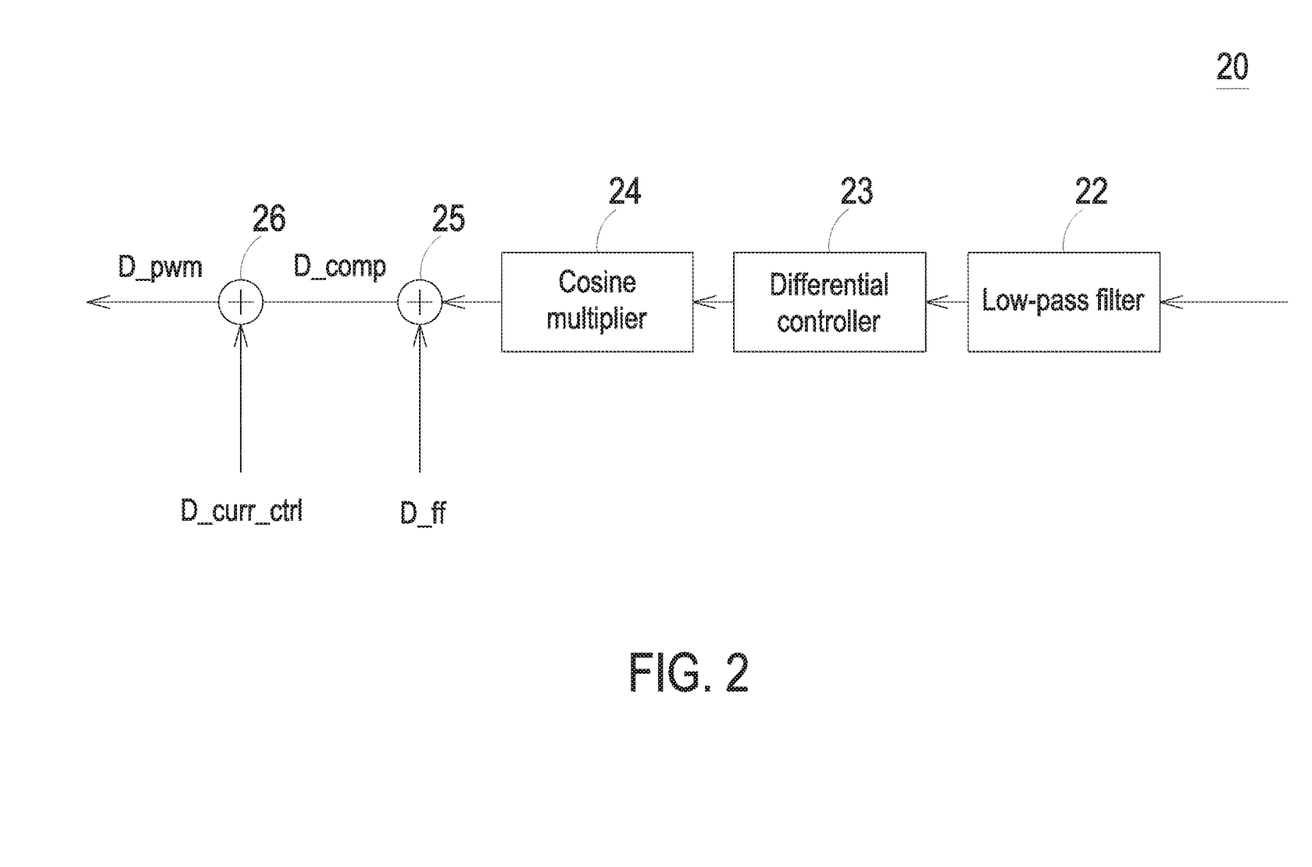
FIG. 2 schematically illustrating the operating principle of the control unit of the power factor correction circuit of FIG. 1.

FIG. 2 schematically illustrating the operating principle of the control unit of the power factor correction circuit of FIG. 1. The control unit 20 comprises a low-pass filter 22, a differential controller 23, a cosine multiplier 24, a first adder 25 and a second adder 26.

The low-pass filter 22 continuously receives a sampled signal that reflects a present current value of the input current In. Moreover, the low-pass filter 22 filters the sampled signal.

The differential controller 23 is electrically connected to the low-pass filter 22 to receive the filtered sampled signal from the low pass filters 22. Moreover, the differential controller 23 has a register for temporarily storing the filtered sampled signal. Whenever a new filtered sampled signal from the low-pass filter 22 is received, the old filtered sampled signal in the register is replaced with the new filtered sampled signal. Before the old filtered sampled signal in the register is replaced with the new filtered sampled signal, the differential controller 23 predicts the waveform of the input current Iin corresponding to the new filtered sampled signal, and the differential controller 23 predicts the waveform of the input current corresponding to the old filtered sampled signal. Moreover, the differential controller 23 compares the waveform of the predicted new input current Iin with the waveform of the predicted old input current. According to the difference between the waveform of the predicted new input current Iin and the waveform of the predicted old input current, the differential controller 23 generates a current error signal.

If no signal has been stored in the register, the current error signal outputted from the differential controller 23 is zero. When the power factor correction circuit 1 is in a non-usage status, no signal is stored in the register of the differential controller 23. After the power factor correction circuit 1 is enabled and the differential controller 23 receives the filtered sampled signal for the first time, no signal is stored in the register and thus the current error signal is zero. Then, the filtered sampled signal is received by the differential controller 23 and stored in the register. When the differential controller 23 receives the filtered sampled signal for the second time, the differential controller 23 predicts the waveform of the new input current Iin corresponding to the new filtered sampled signal (i.e., the signal received for the second time), and the differential controller 23 predicts the waveform of the input current corresponding to the old filtered sampled signal (i.e., the signal received for the first time). According to the difference between these two waveforms, the differential controller 23 generates the current error signal. Then, the new filtered sampled signal (i.e., the signal received for the second time) is stored in the register. Consequently, the old filtered sampled signal in the register is replaced with the new filtered sampled signal.

That is, the differential controller 23 predicts the waveform of the input current Iin corresponding to the present filtered sampled signal, and the differential controller 23 predicts the waveform of the input current Iin corresponding to the previous filtered sampled signal. According to the difference between these two waveforms, the differential controller 23 generates the current error signal. Then, the present filtered sampled signal is stored in the register.

In an embodiment, the differential controller 23 has a compensation factor, which is a constant. After the waveform of the input current Iin corresponding to the present filtered sampled signal is compared with the waveform of the input current Iin corresponding to the previous filtered sampled signal, the comparing result is multiplied by the compensation factor. Consequently, the current error signal is acquired. The compensation factor is a positive value or a negative value. Moreover, the compensation factor is preset according to the phase difference between the input current Iin and the input voltage Vin.

The cosine multiplier 24 is electrically connected with the differential controller 23 to receive the current error signal. After the current error signal is adjusted by the cosine multiplier 24, an adjusted signal is generated. Since the current error signal is adjusted by the cosine multiplier 24, the waveform change of the current error signal at the peak value is reduced and the waveform change of the current error signal at the zero is increased.

The first adder 25 is electrically connected with the cosine multiplier 24. The first adder 25 adds a feedforward signal D_ff to the adjusted signal from the cosine multiplier 24, and generates a phase compensation signal D_comp. Due to the feedforward signal D_ff, the output current Iout can be adjusted according to the input voltage Vin. Consequently, the phase of the input current Iin and the phase of the input voltage Vin are adjusted to be identical. In an embodiment, the feedforward signal D_ff is determined according to the input voltage Vin and the output voltage Vout. The relationships between the feedforward signal D_ff, the input voltage Vin and the output voltage Vout are expressed by the following mathematic formula (1):

$$D\_ff = 1 - (Vin/Vout) \qquad (1)$$

If the current error signal outputted from the differential controller 23 is zero, the adjusted signal from the cosine multiplier 24 is also zero. Under this circumstance, the phase compensation signal D_comp is equal to the feedforward signal D_ff. If the current error signal outputted from the differential controller 23 is not zero, the signal received by the first adder 25 contains the adjusted signal from the cosine multiplier 24 and the feedforward signal D_ff. Under this circumstance, the phase compensation signal D_comp is equal to the sum of the adjusted signal and the feedforward signal D_ff.

The second adder 26 is electrically connected with the first adder 25. The second adder 26 adds a current control signal D_curr_ctrl to the phase compensation signal D_comp, and generates the pulse width modulation signal D_pwm. The current control signal D_curr_ctrl is generated according to a result of comparing a current feedback value with a preset current. The current control signal D_curr_ctrl is used to adjust the output current Iout to be the preset current.

Figure 3:
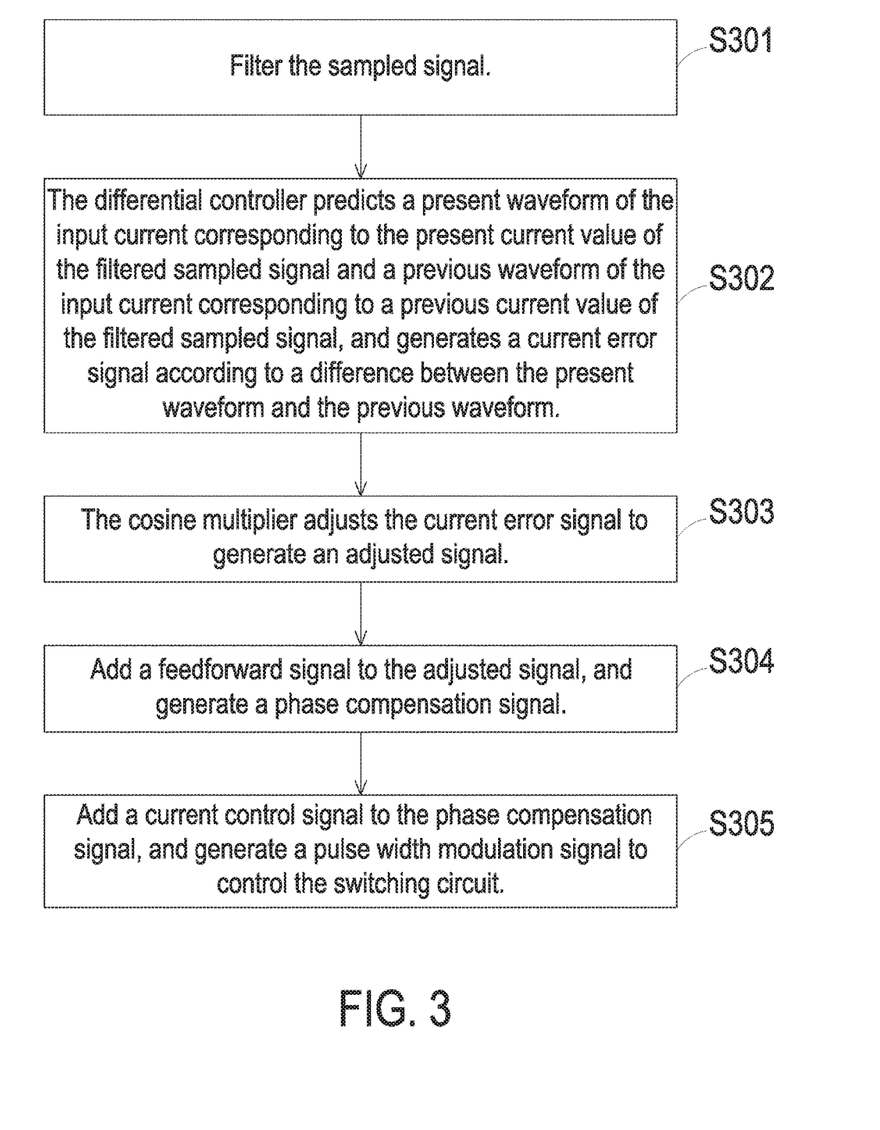
FIG. 3 is a flowchart illustrating a phase compensation method for the power factor correction circuit of FIG. 1.

FIG. 3 is a flowchart illustrating a phase compensation method for the power factor correction circuit of FIG. 1. Please refer to FIGS. 1, 2 and 3. The phase compensation method comprises the following steps.

Firstly, a sampled signal is generated by sampling a present current value of the input signal Vin, and the low-pass filter 22 filters the sampled signal (Step S301).

Then, the differential controller 23 predicts a present waveform of the input current Iin corresponding to the present current value of the filtered sampled signal and a previous waveform of the input current Iin corresponding to a previous current value of the filtered sampled signal, compares the present waveform with the previous waveform, and generates a current error signal according to the comparing result (Step S302).

Then, the first adder 25 adds a feedforward signal D_ff and the adjusted signal, and generates a phase compensation signal D_comp, wherein the feedforward signal D_ff is determined according to the input voltage Vin and the output voltage Vout (Step S304).

Then, the second adder 26 adds a current control signal D_curr_ctrl to the phase compensation signal D_comp, and generates a pulse width modulation signal D_pwm to control the switching circuit 10 to adjust the phase of the output current Iout (Step S305). The current control signal D_curr_ctrl is generated according to a result of comparing a current feedback value with a preset current.

In the step S305, the phase of the output current Iou is adjusted according to the pulse width modulation signal D_pwm. Consequently, the phase of the input voltage Vin is correspondingly adjusted. Since the phase of the input current and the phase of the output current are identical, the phase of the input current Iin is correspondingly changed with the adjustment of the output current Iout. In such way, the phase of the input current Iin is adjusted to be identical to the phase of the input voltage Vin.

In accordance with the feature of the present invention, the low-pass filter 22, the differential controller 23 and the cosine multiplier 24 are employed to perform the steps S301, S302 and S303. Consequently, the zero-crossing distortion is effectively suppressed, the total harmonic distortion is decreased, and the power transmission efficiency is enhanced.

In the step S302, the differential controller 23 receives the filtered sampled signal for the first time after the power factor correction circuit 1 is first turned on. Meanwhile, the current error signal is zero, and thus the phase compensation signal D_comp is equal to the feedforward signal D_ff in the step S304. In addition, the pulse width modulation signal D_pwm generated according to the current control signal D_curr_ctrl and the phase compensation signal D_comp is used to control the switching circuit 10 only. Consequently, the phase of the input current Iin is adjusted to be identical to the phase of the input voltage Vin.

Figure 4:
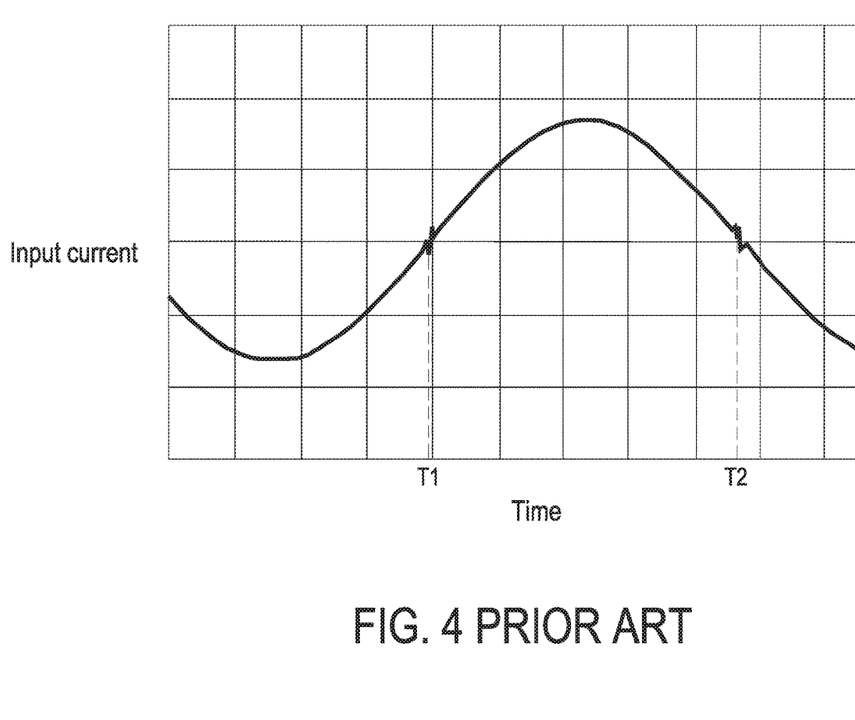
FIG. 4 is a schematic timing waveform diagram illustrating the input current processed by the conventional power factor correction circuit.
Figure 5:
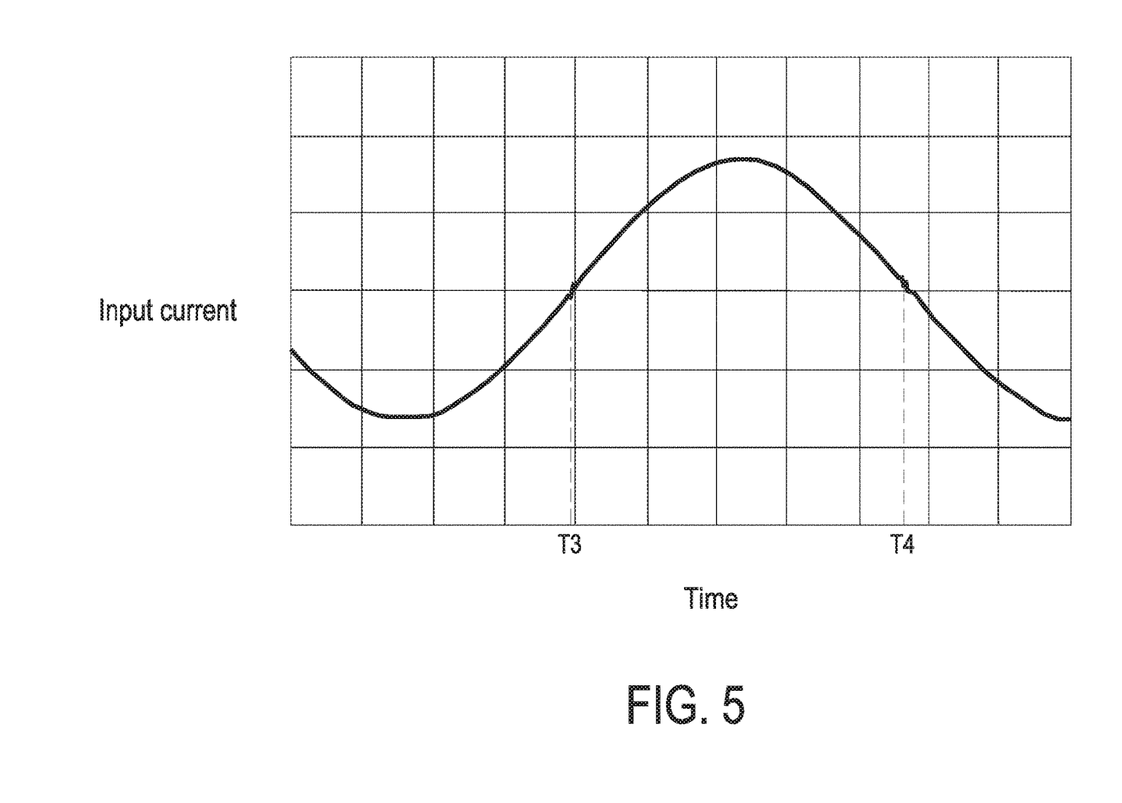
FIG. 5 is a schematic timing waveform diagram illustrating the input current processed by the power factor correction circuit and the phase compensation method of the present invention.

FIG. 4 is a schematic timing waveform diagram illustrating the input current processed by the conventional power factor correction circuit. FIG. 5 is a schematic timing waveform diagram illustrating the input current processed by the power factor correction circuit and the phase compensation method of the present invention.

Please refer to FIG. 4. As previously described, the conventional power factor correction circuit usually comprises a bridge rectifier diode and a high frequency filtering capacitor. Since the bridge rectifier diode has forward voltage drop and the high frequency filtering capacitor is located downstream of the bridge rectifier diode, the AC input current may cease and distort in the vicinity of the zero-crossing point of the AC output voltage (e.g. at the time points T1 and T2). Under this circumstance, the zero-crossing distortion occurs, and the total harmonic distortion increases.

Please refer to FIG. 5. By the power factor correction circuit and the phase compensation method of the present invention, the distortion of the AC input current in the vicinity of the zero-crossing point of the AC output voltage (e.g. at the time points T3 and T4) is largely decreased. When compared with the conventional technology, the power factor correction circuit and the phase compensation method of the present invention are capable of effectively suppressing the zero-crossing distortion, decreasing the total harmonic distortion and enhancing the power transmission efficiency.

From the above descriptions, the present invention provides a phase compensation method for a power factor correction circuit. Firstly, the sampled signal is filtered. Then, the differential controller predicts a present waveform of the input current corresponding to the present current value of the filtered sampled signal and a previous waveform of the input current corresponding to a previous current value of the filtered sampled signal, and generates a current error signal according to a difference between the present waveform and the previous waveform. Then, the cosine multiplier adjusts the current error signal to generate an adjusted signal. Then, a feedforward signal is added to the adjusted signal, so that a phase compensation signal is generated. Afterwards, a current control signal is added to the phase compensation signal, so that a pulse width modulation signal is generated to control the switching circuit. By the phase compensation method, the phase of the input current and the phase of the input voltage are adjusted to be identical. Moreover, the zero-crossing distortion is effectively suppressed, the total harmonic distortion is decreased, and the power transmission efficiency is enhanced. Moreover, the current error signal is adjusted by the cosine multiplier, the waveform change of the current error signal at the peak value is reduced and the waveform change of the current error signal at the zero is increased. In other words, the stability of the power factor correction circuit of the present invention is enhanced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for phase compensating a power factor correction circuit, the power factor correction circuit comprising a switching circuit and a control unit and receiving an input voltage and an input current, the switching circuit being alternately turned on or turned off to generate an output voltage and an output current under control of the control unit, the control unit comprising a low-pass filter, a differential controller and a cosine multiplier, the low-pass filter continuously receiving a sampled signal that reflects a present current value of the input current, the method comprising steps of:
(a) the low-pass filter filtering the sampled signal;
(b) the differential controller predicting a present waveform of the input current corresponding to the present current value of the filtered sampled signal and a previous waveform of the input current corresponding to a previous current value of the filtered sampled signal and generating a current error signal according to a difference between the present waveform and the previous waveform;
wherein the differential controller stores a compensation factor;
wherein in the step (b), the difference between the present waveform and the previous waveform is multiplied by the compensation factor, so that the current error signal is generated;
(c) the cosine multiplier adjusting the current error signal, thereby generating an adjusted signal;
(d) adding a feedforward signal to the adjusted signal, thereby generating a phase compensation signal; and
(e) adding a current control signal to the phase compensation signal, thereby
generating a pulse width modulation signal to control the switching circuit.

2. The method according to claim 1, wherein the differential controller further comprises a register, and the filtered sampled signal is stored in the register.

3. The method according to claim 1, wherein in the step (d), the feedforward signal is determined according to the input voltage and the output voltage.

4. The method according to claim 3, wherein the feedforward signal is equal to $1-(V_{in}/V_{out})$, wherein $V_{in}$ is the input voltage, and $V_{out}$ is the output voltage.

5. The method according to claim 1, wherein in the step (e), the current control signal is generated according to a result of comparing a current feedback value with a preset current.

6. The method according to claim 1, wherein the compensation factor is a positive value or a negative value.

7. The method according to claim 1, wherein the compensation factor is preset according to a phase difference between the input current and the input voltage.

* * * * *